US009762048B2

(12) United States Patent
Tanaka et al.

(10) Patent No.: US 9,762,048 B2
(45) Date of Patent: Sep. 12, 2017

(54) SEMICONDUCTOR DEVICE

(71) Applicant: FUJI ELECTRIC CO., LTD., Kawasaki-shi, Kanagawa (JP)

(72) Inventors: Takahide Tanaka, Matsumoto (JP); Masaharu Yamaji, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/340,885

(22) Filed: Nov. 1, 2016

(65) Prior Publication Data

US 2017/0170647 A1 Jun. 15, 2017

(30) Foreign Application Priority Data

Dec. 15, 2015 (JP) ................. 2015-244685

(51) Int. Cl.
| | |
|---|---|
| H01L 23/58 | (2006.01) |
| H02H 3/28 | (2006.01) |
| H01L 29/40 | (2006.01) |
| H01L 49/02 | (2006.01) |
| H01L 27/06 | (2006.01) |
| H01L 27/02 | (2006.01) |
| H02H 1/00 | (2006.01) |
| G01R 19/165 | (2006.01) |

(52) U.S. Cl.
CPC .......... *H02H 3/28* (2013.01); *G01R 19/1659* (2013.01); *H01L 27/0251* (2013.01); *H01L 27/0629* (2013.01); *H01L 28/20* (2013.01); *H01L 29/405* (2013.01); *H02H 1/0007* (2013.01)

(58) Field of Classification Search
CPC . H01L 27/0251; H01L 27/0629; H01L 28/20; H01L 29/405; H02H 3/28; H02H 1/0007; G01R 19/1659
USPC ........................................................ 257/48
See application file for complete search history.

(56) References Cited

U.S. PATENT DOCUMENTS

| | | | |
|---|---|---|---|
| 6,150,702 A | 11/2000 | Funaki et al. | |
| 8,928,397 B2 * | 1/2015 | Kodera | H01L 27/0802 327/308 |

(Continued)

FOREIGN PATENT DOCUMENTS

| | | |
|---|---|---|
| JP | H11-27950 A | 1/1999 |
| JP | 2000-252426 A | 9/2000 |

(Continued)

*Primary Examiner* — Tu-Tu Ho
(74) *Attorney, Agent, or Firm* — Rabin & Berdo, P.C.

(57) ABSTRACT

A first sense resistor is connected between a fourth terminal of a power source potential of a high-potential region and a first terminal of a ground potential. A second sense resistor is connected between a third terminal of a reference potential of the high-potential region and the first terminal. A comparator is disposed in a low-potential region and uses the ground potential as a reference potential for operation. The comparator compares a voltage between an intermediate potential point of the first sense resistor and an intermediate potential point of the second sense resistor with a predetermined reference voltage. The output of the comparator is input through a control circuit and a level shift circuit to a high-side drive circuit driving an upper-arm IGBT. The output of the comparator is input to a driver circuit driving a lower-arm IGBT.

4 Claims, 9 Drawing Sheets

(56) References Cited

U.S. PATENT DOCUMENTS

2004/0046225 A1  3/2004  Feiler
2014/0048911 A1  2/2014  Suzuki et al.

FOREIGN PATENT DOCUMENTS

JP  2003-008009 A  1/2003
JP  2013-085419 A  5/2013

\* cited by examiner

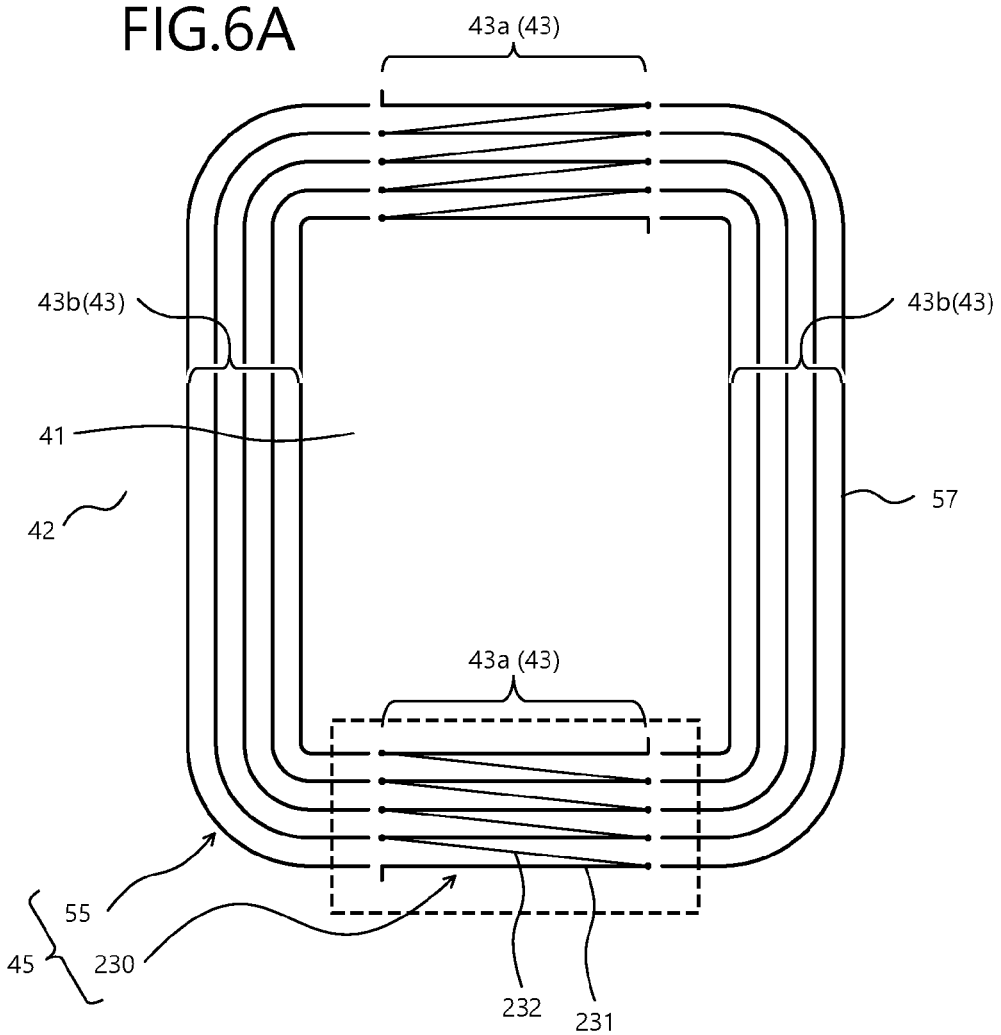
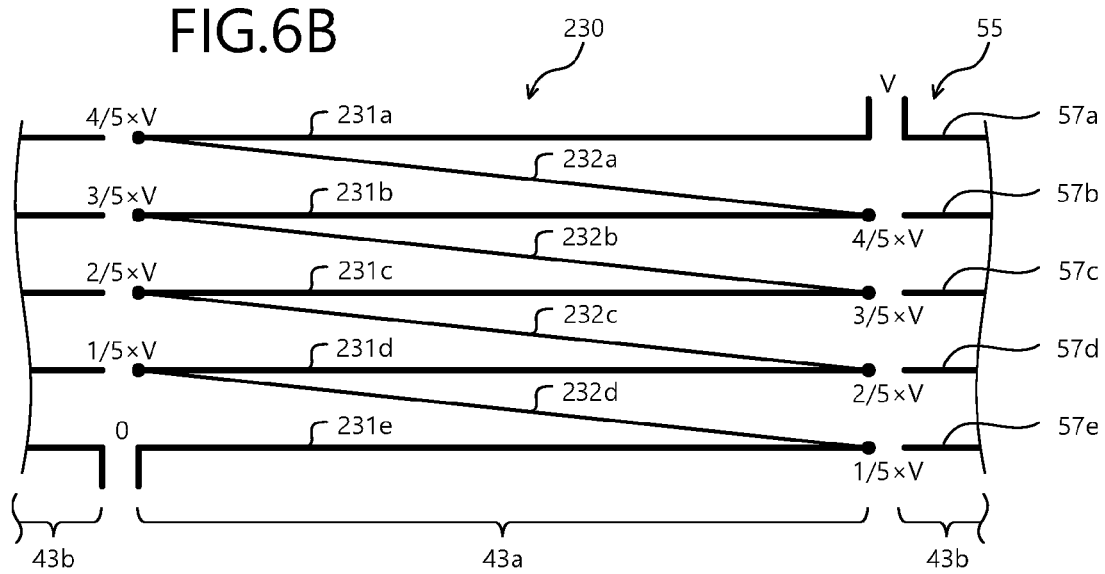

SEMICONDUCTOR DEVICE

CROSS REFERENCE TO RELATED APPLICATIONS

This application is based upon and claims the benefit of priority of the prior Japanese Patent Application No. 2015-244685, filed on Dec. 15, 2015, the entire contents of which are incorporated herein by reference.

BACKGROUND OF THE INVENTION

1. Field of the Invention

The embodiments discussed herein relate to a semiconductor device.

2. Description of the Related Art

Use of a bootstrap circuit to supply voltage to a high-side (high-potential) circuit portion of a high voltage integrated circuit (HVIC) is generally known. A capacitor in the bootstrap circuit operates such that constant voltage may be supplied to the high-side circuit portion while repeating discharge and charge. However, voltage abnormality may occur in the bootstrap circuit whereby sufficient voltage may not be supplied from the capacitor in the bootstrap circuit to the high-side circuit portion. As a semiconductor circuit device to avoid this problem, a device has been proposed that monitors the voltage applied to both ends of a bootstrap capacitor to control ON/OFF at the output stage at the time of voltage abnormality of the bootstrap capacitor (see, e.g., Japanese Laid-Open Patent Publication Nos. H11-027950 and 2013-085419).

A configuration of a conventional semiconductor circuit device including a bootstrap circuit will be described. FIGS. 7 and 9 are circuit diagrams of circuit configurations of conventional semiconductor circuit devices. FIG. 8 is a circuit diagram of detailed configurations of circuit blocks of FIG. 7. In FIGS. 7 to 9, identical constituent elements are denoted by the same reference numerals. FIGS. 7 and 8 are FIGS. 1 and 2 of Japanese Laid-Open Patent Publication No. H11-027950. FIG. 9 is FIG. 1 of Japanese Laid-Open Patent Publication No. 2013-085419. The semiconductor circuit device depicted in FIG. 7 is a load drive circuit supplying electric power to a load 111 connected to a connection point of two transistors 101, 102 making up one phase of a half-bridge circuit serving as an output stage. This semiconductor circuit device includes first and second drive circuits 103, 104, a bootstrap diode 105, a bootstrap capacitor 106, a voltage detection circuit 109, first and second level shift circuits 107, 108, and a refresh operation circuit 110.

The first drive circuit 103 controls the gate drive of the high-potential transistor (hereinafter referred to as the upper arm transistor) 101 based on a control signal input from a first input terminal 121. The second drive circuit 104 controls the gate drive of the low-potential transistor (hereinafter referred to as the lower arm transistor) 102 based on a control signal input from a second input terminal 122. The source of the upper arm transistor 101 is connected to a bootstrap circuit made up of the bootstrap diode 105 and the bootstrap capacitor 106. The bootstrap circuit keeps a bootstrap voltage VBS of an upper arm constant. Thus, the bootstrap capacitor 106 is charged by a control power source voltage VCN applied via the bootstrap diode 105.

The first level shift circuit 107 shifts the level of the control signal input from the first input terminal 121 and supplies the control signal to the first drive circuit 103. The second level shift circuit 108 shifts the level of a signal based on an output signal of the voltage detection circuit 109 and supplies the signal to the refresh operation circuit 110. The refresh operation circuit 110 determines whether a refresh operation is to be performed, based on a detection signal of the voltage detection circuit 109. The voltage detection circuit 109 uses voltage-dividing resistors R1, R2 (see FIG. 8) connected in parallel with the bootstrap capacitor 106 to monitor the voltage applied to both ends of the bootstrap capacitor 106 (hereinafter referred to as a bootstrap voltage VBS).

Based on the signal from the second level shift circuit 108, the refresh operation circuit 110 supplies a signal controlling the lower arm transistor 102 to the second drive circuit 104. If the voltage detection circuit 109 detects that the bootstrap voltage VBS becomes equal to or lower than a predetermined voltage (at the time of occurrence of voltage abnormality), the refresh operation circuit 110 is supplied with the detection signal of the voltage detection circuit 109, with the level being shifted by the level shift circuit 108. In this case, for example, the refresh operation circuit 110 outputs a control signal making an ON period of the lower arm transistor 102 longer to prolong the charge period of the bootstrap capacitor 106.

As is the case with the semiconductor circuit device depicted in FIG. 7, the semiconductor circuit device depicted in FIG. 9 includes the two transistors 101, 102, the first and second drive circuits 103, 104, the bootstrap diode 105, the bootstrap capacitor 106, and the voltage detection circuit 109. The semiconductor circuit device depicted in FIG. 9 further includes a suspension period control circuit 112. In the semiconductor circuit device depicted in FIG. 9, when the bootstrap voltage VBS is detected to become lower than a predetermined voltage (at the time of occurrence of voltage abnormality), the voltage detection circuit 109 suspends output of a gate signal to the upper arm transistor 101. In this case, the suspension period control circuit 112 detects the suspension of the output of the gate signal to the upper arm transistor 101 and controls the voltage detection circuit 109 so as not to prolong the period of suspended output of the gate signal more than necessary.

With progressive advancements in the functionality of HVICs, a recently proposed device includes a function of detecting an output potential VS of a half-bridge circuit serving as an output stage so as to correct deviation of output voltage. The output potential VS is detected by using a resistive element built-in between the output potential VS and a ground potential GND of the HVIC, for example.

SUMMARY OF THE INVENTION

According to one aspect of the present invention, a semiconductor device includes a first semiconductor region disposed on a semiconductor substrate and having a varying reference potential; a second semiconductor region disposed on the semiconductor substrate and fixed to a potential lower than the first semiconductor region; and two or more resistive elements disposed between the first semiconductor region and the second semiconductor region and each having both ends thereof electrically connected to the first semiconductor region and the second semiconductor region, the two or more resistive elements each outputting a different signal corresponding to a potential difference.

In the semiconductor device, the two or more resistive elements have respectively differing potentials on a high-potential side.

The semiconductor device further includes a comparison circuit disposed in the second semiconductor region, and comparing signals of the resistive elements and a predetermined signal. The comparison circuit compares respective signals of the resistive elements, and a potential difference in the first semiconductor region is detected based on a comparison result from the comparison circuit.

The semiconductor device further includes the resistive element having a high-potential side connected to the reference potential of the first semiconductor region, and the resistive element having a high-potential side connected to a maximum potential of the first semiconductor region. The comparison circuit detects a potential difference between the reference potential and the maximum potential of the first semiconductor region.

Objects, features, and advantages of the present invention are specifically set forth in or will become apparent from the following detailed description of the invention when read in conjunction with the accompanying drawings.

BRIEF DESCRIPTION OF THE DRAWINGS

FIGS. 6A and 6B are plane views of a planar layout of an edge termination structure of the semiconductor device according to a third embodiment;

DETAILED DESCRIPTION OF THE INVENTION

Figure 1:
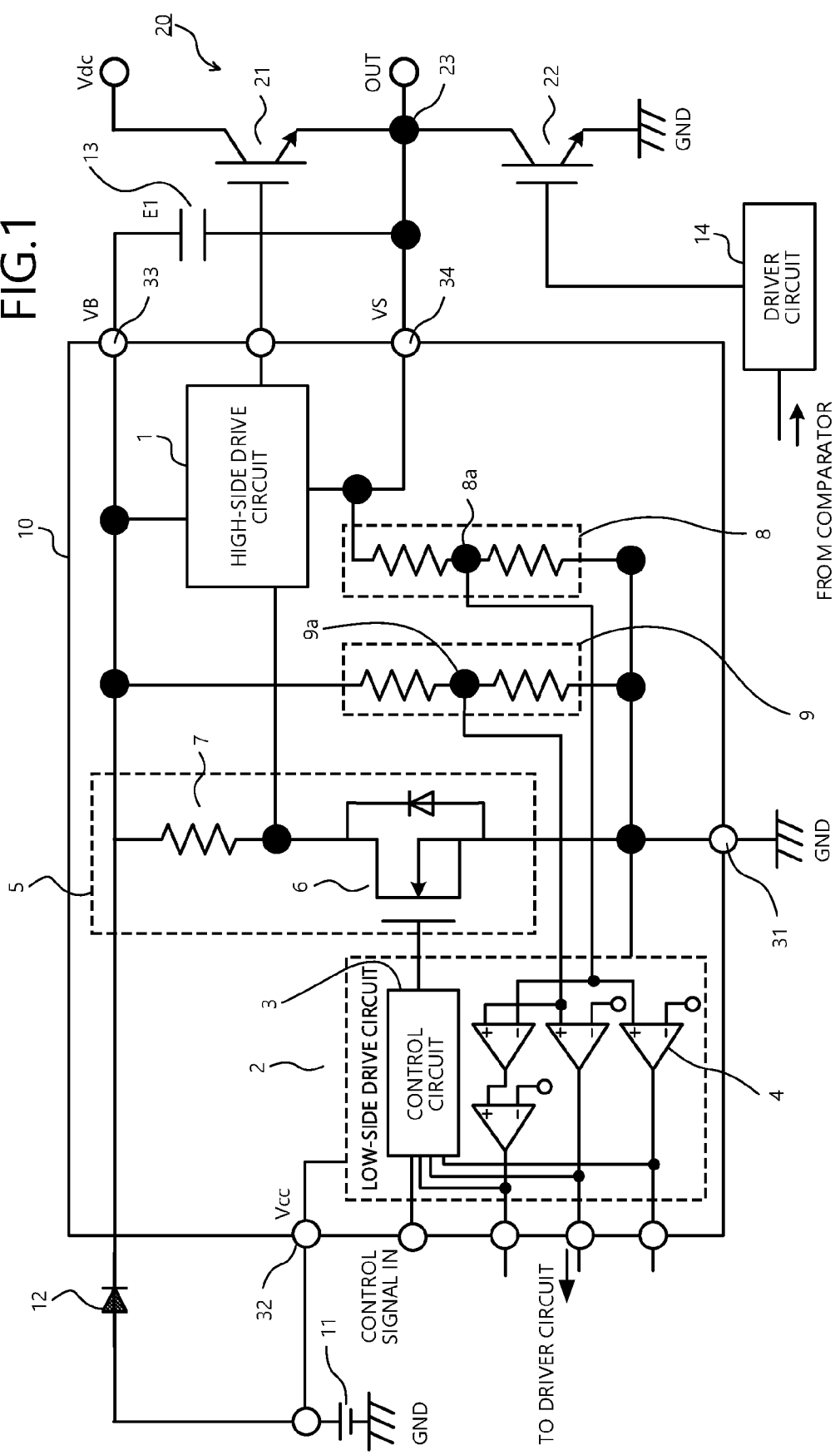
FIG. 1 is a circuit diagram of a circuit configuration of a semiconductor device according to a first embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

A structure of a semiconductor device according to a first embodiment will be described. FIG. 1 is a circuit diagram of a circuit configuration of the semiconductor device according to the first embodiment. In this description, for example, potentials are detected when two insulated gate bipolar transistors (IGBTs) 21, 22 making up one phase of a bridge circuit 20 serving as an output stage are driven. The IGBTs 21, 22 are connected in series between a high voltage power source Vdc and a ground potential GND. A semiconductor device 10 according to the first embodiment depicted in FIG. 1 includes a high-side drive circuit 1, a low-side drive circuit 2, a level shift circuit 5, first and second sense resistors 8, 9, and first to fourth terminals 31 to 34, on a single semiconductor chip.

The first terminal 31 is a terminal providing the ground potential GND of the semiconductor device 10. The second terminal 32 is a terminal supplying a power source voltage Vcc from a voltage power source 11 to the semiconductor device 10. The third terminal 33 is a terminal providing a power source potential VB of the high-side drive circuit 1. The fourth terminal 34 is a terminal providing an emitter potential VS of the IGBT 21 on the high-potential side (hereinafter referred to as an upper arm). The power source potential VB is the sum of the emitter potential VS of the upper-arm IGBT 21 and a high-side power source. The high-side power source is a voltage E1 by which a bootstrap capacitor 13 is charged from the voltage power source 11 through a bootstrap diode 12. The emitter potential VS of the upper-arm IGBT 21 is a potential at a connection point 23 between the upper-arm IGBT 21 and the IGBT 22 on the lower potential side (hereinafter referred to as a lower arm).

The high-side drive circuit 1 uses the emitter potential VS of the upper-arm IGBT 21 as a reference potential and the power source potential VB as a maximum potential and operates at the power source voltage Vcc. The high-side drive circuit 1 drives the upper-arm IGBT 21 based on an input signal of the level shift circuit 5. The low-side drive circuit 2 is made up of a control circuit 3 and multiple comparators 4. The low-side drive circuit 2 uses, for example, the ground potential GND as the reference potential for operation. The control circuit 3 uses the ground potential GND as the reference potential to operate at the power source voltage Vcc supplied from the second terminal 32 and drives an nch MOSFET 6 of the level shift circuit 5 for increasing the level based on a control signal IN from an external source (such as a microcomputer) or an abnormality sensing signal from an abnormality sensing circuit.

The comparators 4 compare a potential at an intermediate potential point 8a of the first sense resistor 8 and a predetermined reference voltage. The comparators 4 further compare a potential at an intermediate potential point 9a of the second sense resistor 9 and a predetermined reference voltage. The comparators 4 still further compare a voltage (the voltage E1 of the bootstrap capacitor 13) between the intermediate potential point 8a of the first sense resistor 8 and the intermediate potential point 9a of the second sense resistor 9 and a predetermined reference voltage. Output (comparison result) of the comparators 4 is input through the control circuit 3 and the level shift circuit 5, to the high-side drive circuit 1. Output of the comparators 4 is further input to a driver circuit 14. The driver circuit 14 drives the lower-arm IGBT 22. The driver circuit 14 may be disposed on the same semiconductor chip as the semiconductor device 10.

The level shift circuit 5 is made up of the high-voltage nch MOSFET 6 and a level shift resistor 7. The level shift circuit 5 receives the input signal of the low-side drive circuit 2 and drives the high-side drive circuit 1. The first sense resistor 8 is connected between the fourth terminal 34 and the first terminal 31. The first sense resistor 8 is a voltage-dividing resistor for detecting the emitter potential VS of the upper-arm IGBT 21. The second sense resistor 9 is connected between the third terminal 33 and the first terminal 31. The second sense resistor 9 is a voltage-dividing resistor for detecting the power source potential VB of the high-side drive circuit 1. The intermediate potential point 8a of the first sense resistor 8 and the intermediate potential point 9*a* of the second sense resistor 9 are connected to the respective comparators 4.

The semiconductor device 10 depicted in FIG. 1 uses the first and second sense resistors 8, 9 as the voltage-dividing resistors to detect the power source potential VB (hereinafter referred to as the VB potential) of the high-side drive circuit 1, the emitter potential VS (hereinafter referred to as the VS potential) of the upper-arm IGBT 21, and a voltage between the VB potential and the VS potential (hereinafter referred to as the VB-VS voltage). When determining via the comparators 4 that at least one of the VB potential and the VS potential falls below the reference voltage, the semiconductor device 10 depicted in FIG. 1 provides control of giving an alarm, turning off the upper-arm IGBT 21 via the high-side drive circuit 1, or turning off the lower-arm IGBT 22 via the driver circuit 14. When determining via the comparators 4 that the VB-VS voltage falls below the reference voltage, the semiconductor device 10 depicted in FIG. 1 provides control of making a pulse width of the ON period of the lower-arm IGBT 22 longer via the driver circuit 14 to prolong the charging time of the bootstrap capacitor 13. Therefore, by disposing the first and second sense resistors 8, 9 as described, the same function as the level shift circuit for lowering the level is produced without using the level shift circuit for lowering the level.

Figure 2A:
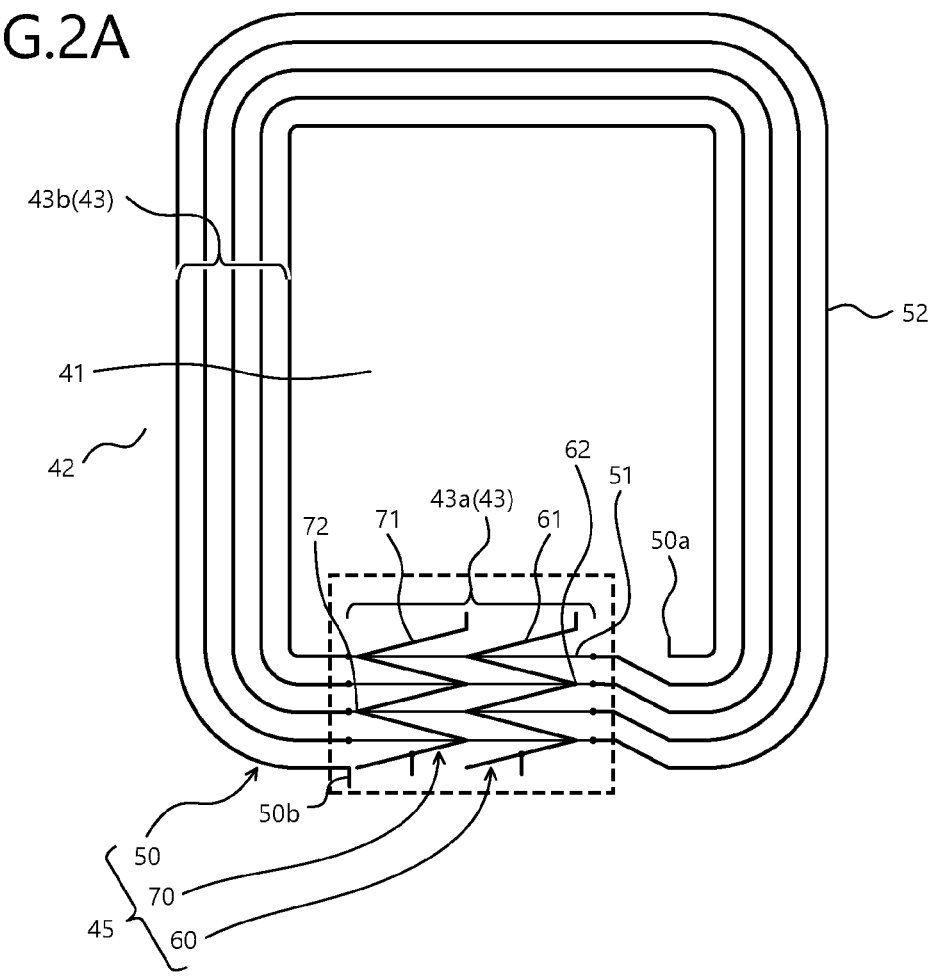
FIGS. 2A and 2B are plane views of a planar layout of a main portion of the semiconductor device according to the first embodiment.
Figure 2B:
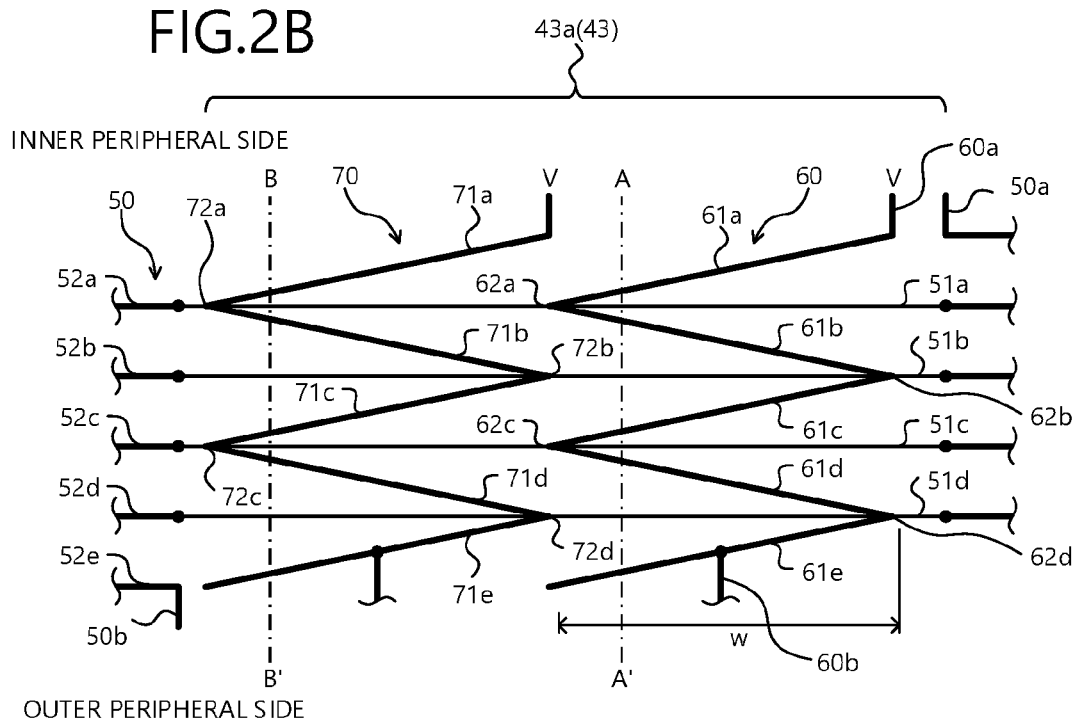

An example of the first and second sense resistors 8, 9 will be described. FIGS. 2A and 2B are plane views of a planar layout of a main portion of the semiconductor device according to the first embodiment. FIG. 2A depicts a planar layout of a resistive field plate (RFP) 45 entirely. FIG. 2B depicts an enlarged view of a portion of the resistive field plate 45 surrounded by a dotted rectangular frame (similarly for FIGS. 5A to 6B). The semiconductor device according to the first embodiment depicted in FIGS. 2A and 2B includes the resistive field plate 45 disposed in an edge termination structure portion 43 between a high-potential (high-side) region (first semiconductor region) 41 and a low-potential (low-side) region (second semiconductor region) 42 so as to surround the high-potential region 41.

The high-potential region 41 is disposed in a substantially rectangular planar layout, for example. The high-potential region 41 is disposed with the high-side circuit portion (not depicted) described above, etc. The high-side circuit portion corresponds to the high-side drive circuit 1 of FIG. 1. The high-side circuit portion is a complementary MOS (CMOS) circuit having a horizontal n-channel MOSFET and a horizontal p-channel MOSFET complementary connected, for example. The high-potential region 41 is electrically connected to the power source potential VB, which is the maximum potential of the high-side circuit portion.

In the low-potential-side region 42, for example, a low-side circuit portion (not depicted), the control circuit 3, etc. in FIG. 1 are arranged. The low-side circuit portion corresponds to the low-side drive circuit 2 in FIG. 1. The low-potential-side region 42 is fixed at, for example, the ground potential GND, which is the minimum potential. The edge termination structure portion 43 is arranged between the high-potential-side region 41 and the low-potential-side region 42, for example, in planar layout of a substantially rectangular frame shape. The edge termination structure portion 43 is configured by a parasitic diode 44 described hereinafter, and electrically separates the high-potential-side region 41 and the low-potential-side region 42. In the edge termination structure portion 43, for example, the resistive field plate 45 may be arranged so as to spread throughout the edge termination structure portion 43.

The resistive field plate 45 is made up of three resistive elements 50, 60, 70. The resistive element 50 (hereinafter, spiral resistive element) is arranged in a spiral-shaped planar layout so as to surround a periphery of the high-potential-side region 41, from the high-potential-side region 41 side (inner peripheral side) to the low-potential-side region 42 side (outer peripheral side). The spiral resistive element 50 has a function of fixing a surface electrode of the edge termination structure portion 43 and maintaining uniformity of the electric field strength of the edge termination structure portion 43. The spiral line of the spiral resistive element 50, for example, may be substantially the same width and arranged at substantially equal intervals. The reason for this is that the potential difference between spiral lines of the spiral resistive element 50 becomes equal, enabling the electric field strength of the edge termination structure portion 43 to be maintained to be uniform, and enabling easy design of the resistive elements 60, 70. The spiral resistive element 50, at a portion of the edge termination structure portion 43 (hereinafter, first edge termination region) 43*a*, is configured by a material and hierarchy different from another portion (hereinafter, second edge termination region) 43*b*.

In particular, the spiral resistive element 50 has in the first edge termination region 43*a*, for example, conductive film layers 51 formed of a conductive material such as metal, and in the second edge termination region 43*b*, for example, has thin-film resistive layers 52 formed of a resistive material such as impurity-dosed poly-silicon (poly-Si). The conductive film layers 51 and the thin-film resistive layers 52 forming the spiral resistive element 50 are coupled via a contact portion penetrating an interlayer insulating film (not depicted). FIGS. 2A and 2B depict the conductive film layers 51 by a thinner line than a line of the thin-film resistive layers 52. The thin-film resistive layers 52 are arranged concentrically to surround the periphery of the high-potential-side region 41 and to form a substantially rectangular planar shape open at the first edge termination region 43*a*.

The conductive film layers 51 are electrically connected on a level different from the thin-film resistive layers 52 to the respective thin-film resistive layers 52, thereby forming portions of spiral lines of the spiral resistive element 50. Therefore, the conductive film layers 51 are arranged in a stripe-shaped planar layout along the peripheral direction of the thin-film resistive layers 52. For example, if the number of spiral lines of the spiral resistive element 50 is five, the four substantially linear conductive film layers 51 (respectively referred to as the first to fourth conductive film layers 51*a* to 51*d* sequentially from the inner peripheral side to the outer peripheral side) are arranged. An open end (inner-peripheral end portion) of an innermost thin-film resistive layer 52*a* and an open end (outer-peripheral end portion) of an outermost thin-film resistive layer 52*e* are an inner-peripheral end portion 50*a* and an outer-peripheral end portion 50*b*, respectively, of the spiral resistive element 50.

The conductivity of the conductive film layer 51 in the spiral resistive element 50, arranged in the first edge termination region 43*a* is such that the voltage substantially does not drop. Therefore, as described hereinafter, even when the resistive elements 60, 70 are arranged in the first edge termination region 43*a* so as to overlap the conductive film layers 51, the potential difference of the resistive elements 60, 70 may be prevented from being adversely affected. Additionally, the thin-film resistive layers 52, which have resistivity, arranged in the second edge termination region 43*b*, enable the resistance value of the spiral resistive element 50 to be high enough to obtain a compelling force (field plate effect) of the surface potential of the edge termination structure portion 43. The resistance value of the spiral resistive element 50 is equal to or greater than the resistance values of the resistive elements 60, 70, and is changed variously in a range enabling the field plate effect to be established.

The ratio of the second edge termination region 43b in which the thin-film resistive layers 52 of the spiral resistive element 50 are arranged is also changed variously in a range enabling the field plate effect to be established. Further, respective ends of the spiral resistive element 50 and the resistive elements 60, 70 are each electrically connected to the high-potential-side region 41 and the low-potential-side region 42. The potential difference of the high-potential-side region 41 and the low-potential-side region 42 is, for example, 600 V or higher, and therefore, for example, when the thin-film resistive layers 52 of the spiral resistive element 50 and the resistive elements 60, 70 are a conductive film layer, the resistance value may become too low, whereby the high-potential-side region 41 and the low-potential-side region 42 may short-circuit. Therefore, the thin-film resistive layers 52 of the spiral resistive element 50 and the resistive elements 60, 70 may be formed by material of low conductivity.

The other resistive elements (hereinafter referred to as meander resistive elements) 60, 70 are sense resistors outputting a signal corresponding to the potential difference of the high-potential region 41 and the low-potential region 42. These meander resistive elements 60, 70 correspond to the first and second sense resistors 8, 9 of FIG. 1. The meander resistive elements 60, 70 are disposed on a level different from the conductive film layers 51 of the spiral resistive element 50 in the first edge termination region 43a and face the conductive film layers 51 in a depth direction across an interlayer insulating film (not depicted). The meander resistive elements 60, 70 may be disposed on the same level as the thin-film resistive layers 52 of the spiral resistive element 50. The meander resistive elements 60, 70 each have respective ends electrically connected to the high-potential region 41 and the low-potential region 42 and are arranged in a planar layout meandering in a lightning shape, for example.

Meandering in a lightning shape means meandering to form an acute angle at turning points so as to form a zigzag-shaped pattern such that segments (hereinafter referred to as linear portions) 61, 71 connecting the turning points (acute apexes) are arranged obliquely to the conductive film layers 51. The numbers of turns of the meander patterns of the meander resistive elements 60, 70 may be the same as the number of the conductive film layers 51. The meander resistive elements 60, 70 may be arranged adjacently to, or away from, each other. When the meander resistive elements 60, 70 are arranged away from each other, the first edge termination regions 43a are located at two positions of the edge termination structure portion 43, and the respective conductive film layers 51 are disposed in the first edge termination regions 43a.

The resistance values of the meander resistive elements 60, 70 are determined according to a response time when a predetermined voltage value is detected, for example. The resistance values of the meander resistive elements 60, 70 may be adjusted respectively by widths w of the meander resistive elements 60, 70 (lengths between the turns in a direction parallel to the conductive film layers 51), for example. The resistance values of the meander resistive elements 60, 70 may be several MΩ (e.g., about 7 MΩ). The meander resistive elements 60, 70 are preferably arranged in a planar layout such that a potential difference $\Delta V$ is equal among positions intersecting the conductive film layers 51 of the spiral resistive element 50 (in this example, turning points 62, 72 of the meander patterns). As a result, local concentrations of electric fields may be avoided on the meander resistive elements 60, 70.

This planar layout of the meander resistive elements 60, 70 avoiding the local electric field concentrations may be designed easily by making the numbers of turns of the meander patterns of the meander resistive elements 60, 70 the same as the number of the conductive film layers 51. For example, the case of the meander resistive element 60 will be described. If the number of turns of the meander pattern of the meander resistive element 60 is four and the same as the number of the conductive film layers 51 and the turning points of the meander pattern (respectively referred to as first to fourth turning points 62a to 62d in order from inside to outside) are respectively located on the first to fourth conductive film layers 51a to 51d, the potential distribution of the meander resistive element 60 is as follows.

The potential of an inner-side end portion 60a is the maximum potential applied to the meander resistive element 60 and is set to be the same potential V [V: volt] as the potential of the inner-peripheral end portion 50a of the spiral resistive element 50. Additionally, the potential of an outer-side end portion 60b is the minimum potential applied to the meander resistive element 60 and is set to be the same 0 [V] as the potential of the outer-peripheral end portion 50b of the spiral resistive element 50. In the spiral resistive element 50, the potential of the first conductive film layer 51a that is innermost and the first thin-film resistive layer 52a is 4/5 (=4/5×V[V]) of the potential V [V] of the inner-peripheral end portion 50a of the spiral resistive element 50. The potential of the second conductive film layer 51b and the second thin-film resistive layer 52b is 3/5 (=3/5×V[V]) of the potential V [V] of the inner-peripheral end portion 50a of the spiral resistive element 50. The potential of the third conductive film layer 51c and the third thin-film resistive layer 52c is 2/5 (=2/5×V[V]) of the potential V [V] of the inner-peripheral end portion 50a of the spiral resistive element 50. The potential of the fourth conductive film layer 51d and the fourth thin-film resistive layer 52d is 1/5 (=1/5×V[V]) of the potential V [V] of the inner-peripheral end portion 50a of the spiral resistive element 50. In other words, the potential difference between spiral lines of the spiral resistive element 50 is 1/5×V [V].

On the other hand, the potential of the innermost first turning point 62a of the meander resistive element 60 is 4/5 (=4/5×V[V]) of the potential V [V] of the inner-side end portion 60a of the meander resistive element 60, equal to the potential of the first conductive film layer 51a of the spiral resistive element 50. The potential of the second turning point 62b of the resistive element 60 is 3/5 (=3/5×V[V]) of the potential V [V] of the inner-side end portion 60a of the meander resistive element 60, equal to the potential of the second conductive film layer 51b of the spiral resistive element 50. The potential of the third turning point 62c of the meander resistive element 60 is 2/5 (=2/5×V[V]) of the potential V [V] of the inner-side end portion 60a of the meander resistive element 60, equal to the potential of the third conductive film layer 51c of the spiral resistive element 50. The potential of the outermost fourth turning point 62d of the meander resistive element 60 is 1/5 (=1/5×V[V]) of the potential V [V] of the inner-side end portion 60a of the meander resistive element 60, equal to the potential of the fourth conductive film layer 51d of the spiral resistive element 50. In other words, the potential difference ΔV between the conductive film layers 51 of the spiral resistive element 50 is 1/5×V[V]. Thus, consistency of the potential distribution of the spiral resistive element 50 and the meander resistive element 60 may be obtained easily.

The potential distribution of the meander resistive element 70 may be set in the same way as the meander resistive element 60 described above. In FIGS. 2A and 2B, linear portions (hereinafter referred to as thin-film resistive linear portions) of the meander pattern of the meander resistive element 60 are respectively denoted by reference numerals 61a to 61e sequentially from the inner peripheral side to the outer peripheral side. Thin-film resistive linear portions of the meander pattern of the meander resistive element 70 are respectively denoted by reference numerals 71a to 71e sequentially from the inner peripheral side to the outer peripheral side. The turning points of the meander pattern of the meander resistive element 70 are respectively denoted by 72a to 72d sequentially from the inside outwardly.

Figure 3:
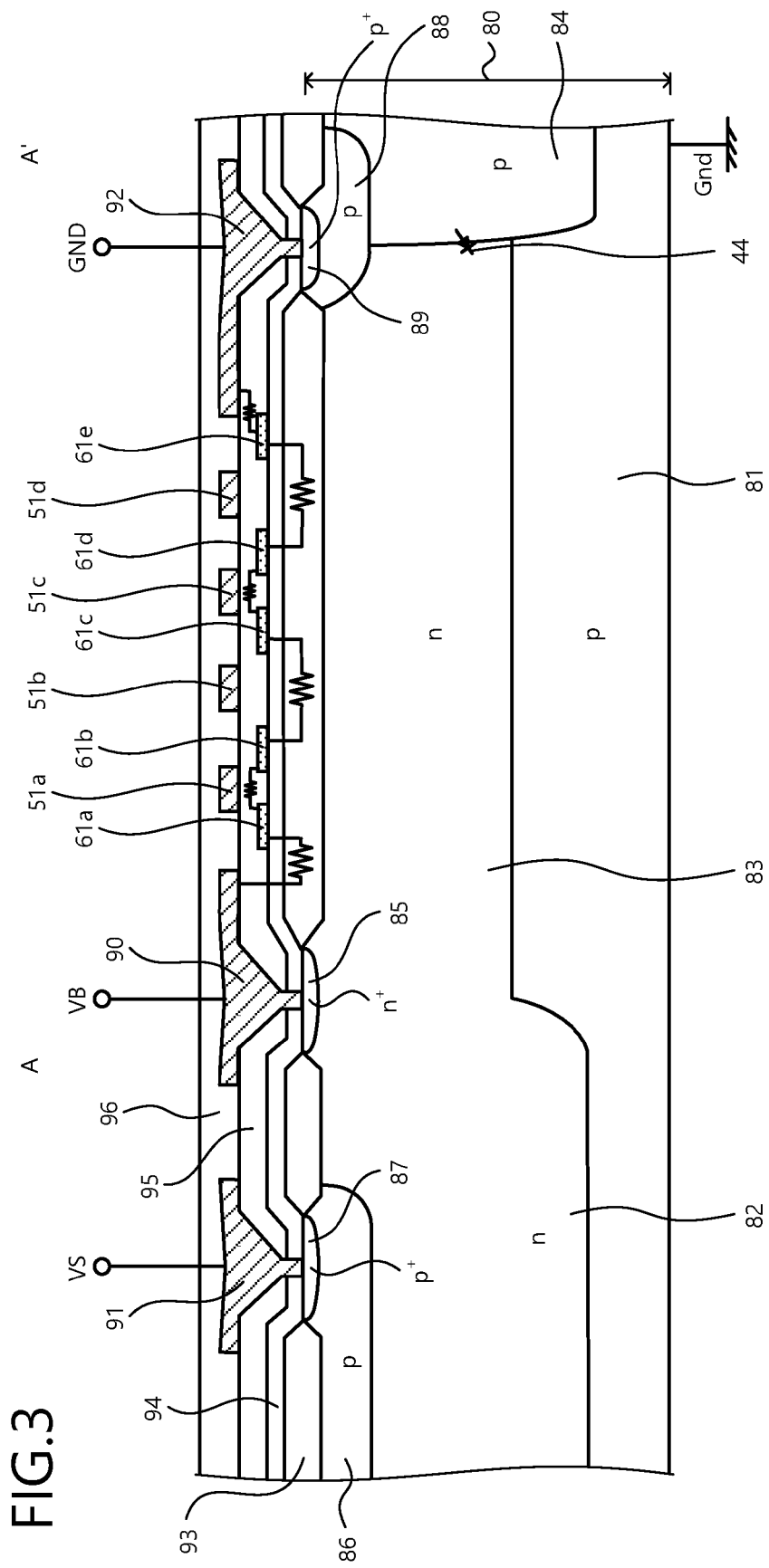
FIG. 3 is a cross-sectional view of a structure along cutting line A-A' of FIG. 2B.
Figure 4:
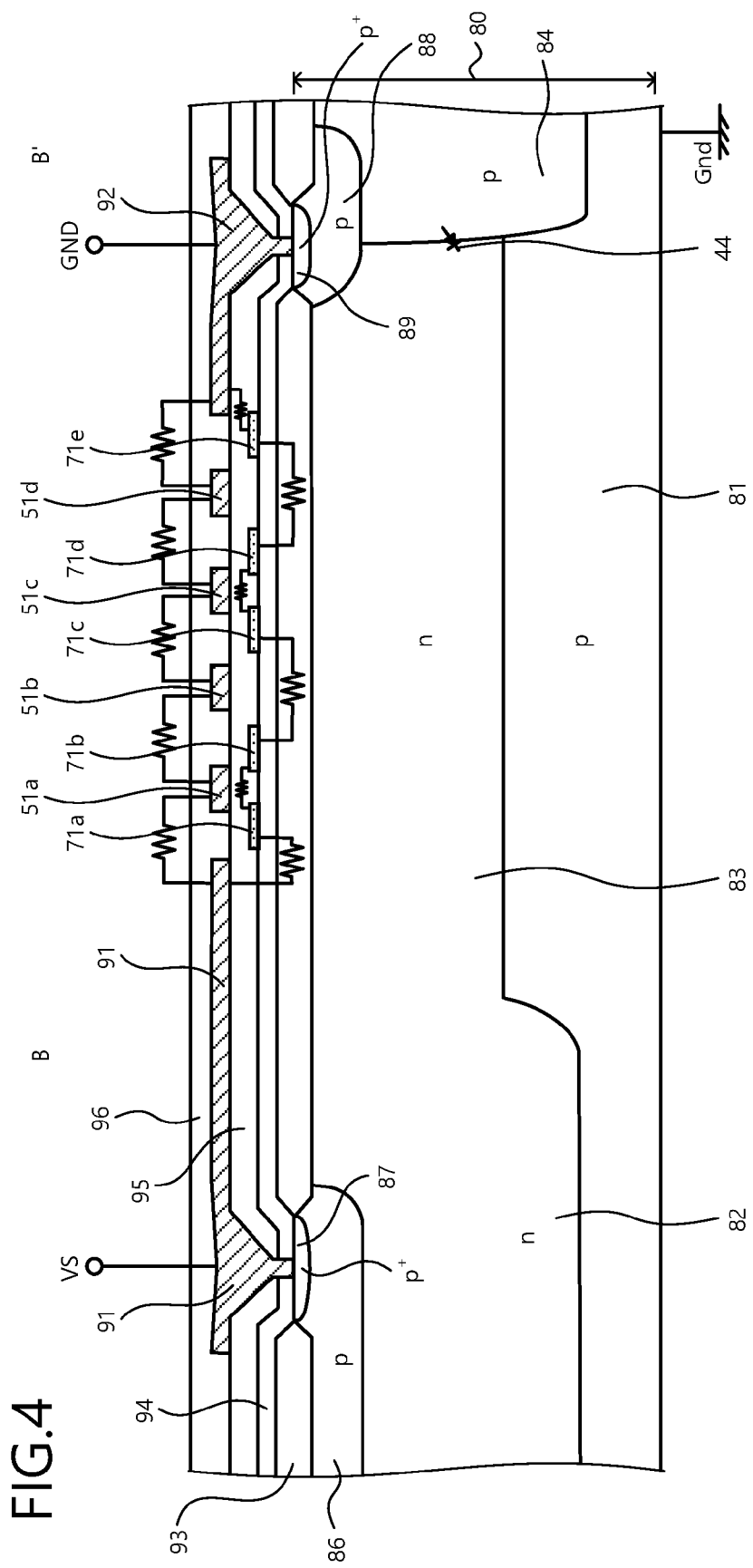
FIG. 4 is a cross-sectional view of the structure along cutting line B-B' of FIG. 2B.

A cross-sectional structure of the semiconductor device according to the first embodiment will be described. FIG. 3 is a cross-sectional view of the structure along cutting line A-A' of FIG. 2B. FIG. 4 is a cross-sectional view of the structure along cutting line B-B' of FIG. 2B. As depicted in FIGS. 3 and 4, in a surface layer of the front surface of the p-type semiconductor substrate 80, an n-type diffusion region 82, an n-type diffusion region 83, and a p-type diffusion region 84 are selectively disposed. A p-type region 81 on the substrate back surface side is fixed at the ground potential GND, which is the minimum potential, for example. The p-type region 81 on the substrate back surface side is a portion of the p-type semiconductor substrate 80 remaining as a p-type region by not forming these regions at a portion deeper from the substrate front surface than the n-type diffusion regions 82, 83, and the p-type diffusion region 84.

The n-type diffusion region 82 configures the high-potential-side region 41. In the n-type diffusion region 82, for example, a horizontal-type p-channel MOSFET of the high-side circuit portion is arranged. Further, in a p-type region 86 disposed in the n-type diffusion region 82, for example, a horizontal-type n-channel MOSFET of the high-side circuit portion is disposed. The n-type diffusion region 83 is arranged farther on the outer side than the n-type diffusion region 82 and contacts the n-type diffusion region 82. The depth of the n-type diffusion region 83, for example, is shallower than the n-type diffusion region 82. The p-type diffusion region 84 is arranged farther on the outer side than the n-type diffusion region 83 and contacts the n-type diffusion region 83. In the p-type diffusion region 84, for example, a p-type region 88 is disposed so as to extend the n-type diffusion region 83.

At a pn junction between the p-type diffusion region 84 and the n-type diffusion region 83, the parasitic diode 44 is formed and the high-potential-side region 41 and the low-potential-side region 42 are electrically separated by the parasitic diode 44. In other words, an n+-type region 85 disposed in the n-type diffusion region 82 functions as a cathode region of the parasitic diode 44 and a p+-type region 89 disposed in the p-type region 88 functions as an anode region of the parasitic diode 44. The low-potential-side region 42 is configured by an n-type diffusion region (not depicted) arranged by the p-type diffusion region 84. The p-type diffusion region 84 may be a portion of the p-type semiconductor substrate 80 remaining in a striped shape so as to be exposed from the p-type region 81 of the substrate back surface side to the substrate front surface. Exposure at the substrate front surface is arranged so as to contact a first insulating film 93 described hereinafter.

A first electrode 90 is electrically connected to the n-type diffusion region 82 through the n+-type region 85. The first electrode 90 is fixed at the power source potential VB of the high-side circuit portion. A second electrode 91 is electrically connected to the p-type region 86 through a p+-type region 87 disposed in the p-type region 86. The second electrode 91 is fixed at the reference potential (the emitter potential VS of the IGBT of the upper arm) of the high-side circuit portion. A third electrode 92 is fixed at the ground potential GND, which is the minimum potential, for example.

On the front surface of the p-type semiconductor substrate 80, portions other than contacts of semiconductor portions and the first to third electrodes 90 to 92 are covered by an insulating layer formed by sequentially stacking the first insulating film 93, a second insulating film 94, and an interlayer insulating film 95. The first insulating film 93, for example, is LOCOS (Local Oxidation of Silicon). The first to third electrodes 90 to 92 respectively extend on the interlayer insulating film 95. The first to third electrodes 90 to 92, the interlayer insulating film 95, and the conductive film layers 51 of the spiral resistive element 50 described hereinafter, for example, are covered by an interlayer insulating film 96.

The thin-film resistive linear portions 61a to 61e of the meander pattern of the meander resistive element 60 are disposed in the interlayer insulating film 95 covering the n-type diffusion region 83 between the n+-type region 85 and the p+-type region 89. The innermost thin-film resistive linear portion 61a of the meander resistive element 60 is electrically connected to the first electrode 90. Additionally, the outermost thin-film resistive linear portion 61e of the meander resistive element 60 is electrically connected to the third electrode 92 (FIG. 3).

The thin-film resistive linear portions 71a to 71e of the meander pattern of the meander resistive element 70 are disposed away from the meander resistive element 60 inside the interlayer insulating film 95 covering the n-type diffusion region 83 between the n+-type region 85 and the p+-type region 89. The innermost thin-film resistive linear portion 71a of the meander resistive element 70 is electrically connected to the second electrode 91. Additionally, the outermost thin-film resistive linear portion 71e of the meander resistive element 70 is electrically connected to the third electrode 92 (FIG. 4).

The conductive film layers 51 (51a to 51d) of the spiral resistive element 50 are disposed in the interlayer insulating film 96 in the portion provided with the meander resistive elements 60, 70 (the first edge termination region 43a). Therefore, the first edge termination region 43a has a vertically laminated field plate made up of the meander resistive elements 60, 70 serving as a first layer and the conductive film layers 51 of the spiral resistive element 50 serving as a second layer.

Although not depicted, both ends of the conductive film layers 51 (51a to 51d) of the spiral resistive element 50 are connected to the respective thin-film resistive layers 52 facing in the depth direction through contact portions penetrating the interlayer insulating film 95. Therefore, a boundary between the first edge termination region 43a and the second edge termination region 43b has a field plate made up of the thin-film resistive layers 52 of the spiral resistive element 50 serving as a first layer and the conductive film layers 51 of the spiral resistive element 50 as a second layer.

As described above, according to the first embodiment, by arranging two or more resistive elements (sense resistors), a signal may be communicated from the low-potential side to the high-potential side without using a level shift circuit for lowering the level. Therefore, voltage abnormality occurring in the apparatus may be communicated to both the high-potential side and the low-potential side without being accompanied by an increase in chip area or difficulties in design/manufacturing. According to the first embodiment, since each of the sense resistors is disposed on the upper or lower side of the resistive field plate across the insulating film, the two resistive elements with independently settable conditions may be arranged without widening the chip area.

Figure 5A:
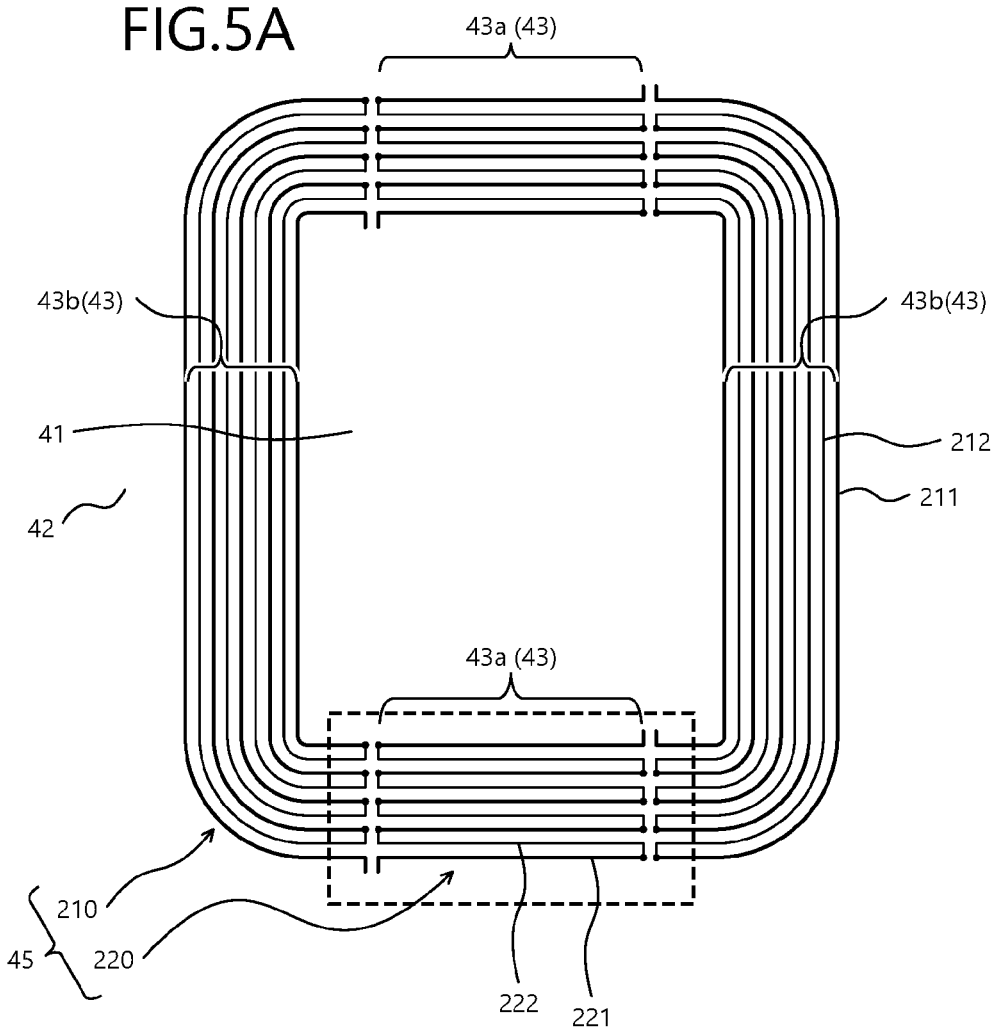
FIGS. 5A and 5B are plane views of a planar layout of a main portion of the semiconductor device according to a second embodiment.
Figure 5B:
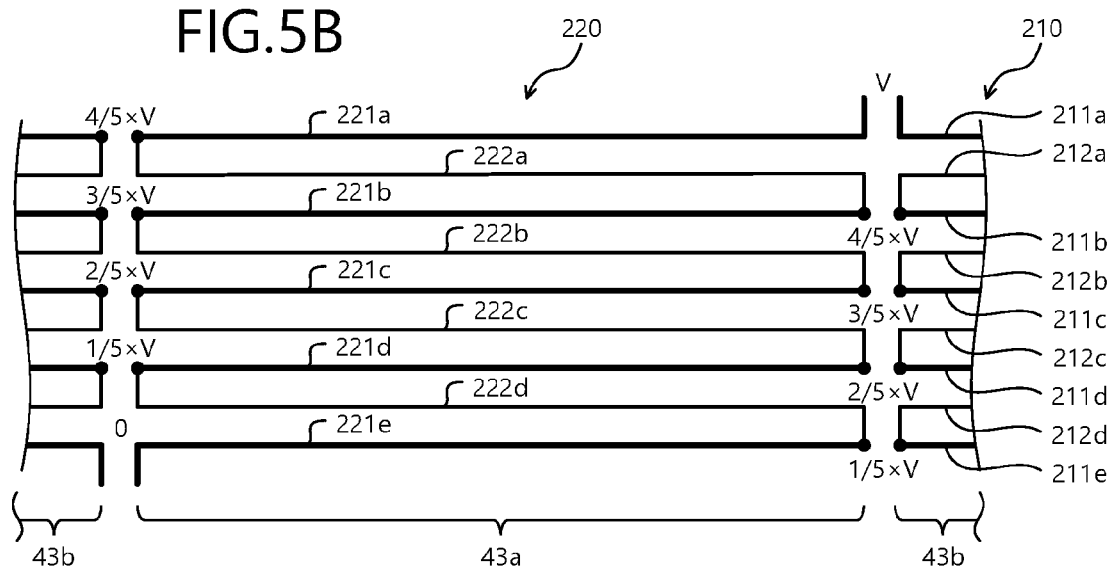
Figure 7:
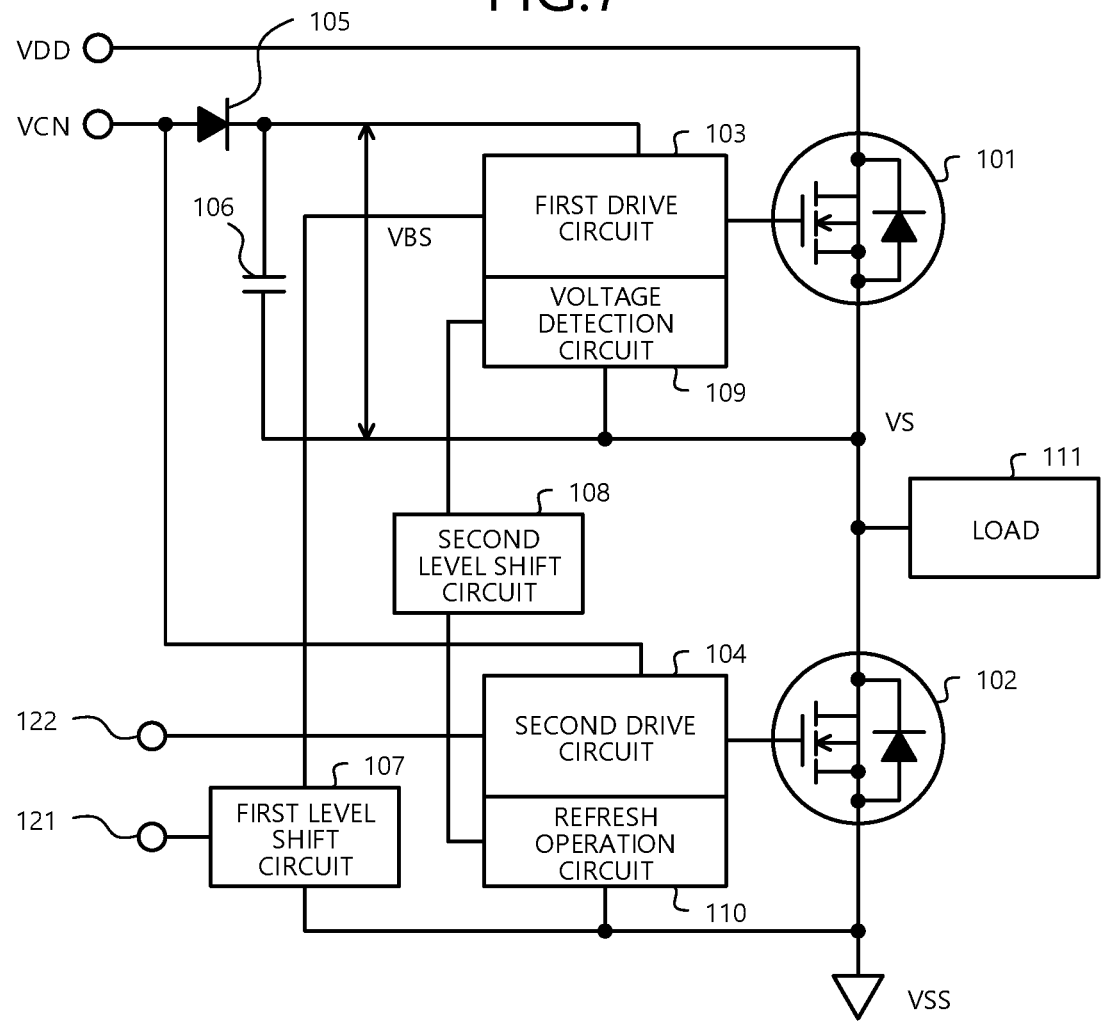
FIG. 7 is a circuit diagram of a circuit configuration of a conventional semiconductor circuit device.
Figure 8:
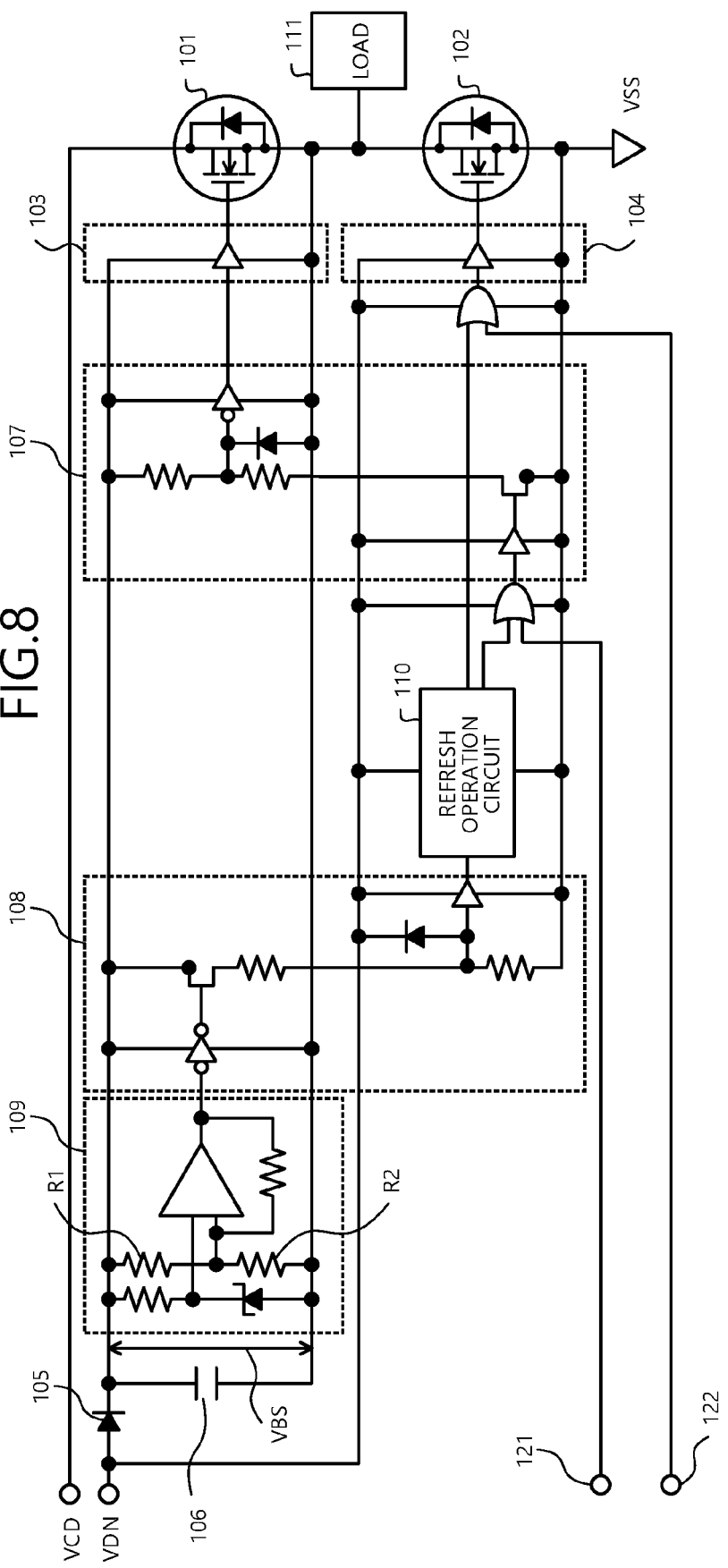
FIG. 8 is a circuit diagram of detailed configurations of circuit blocks of FIG. 7.
Figure 9:
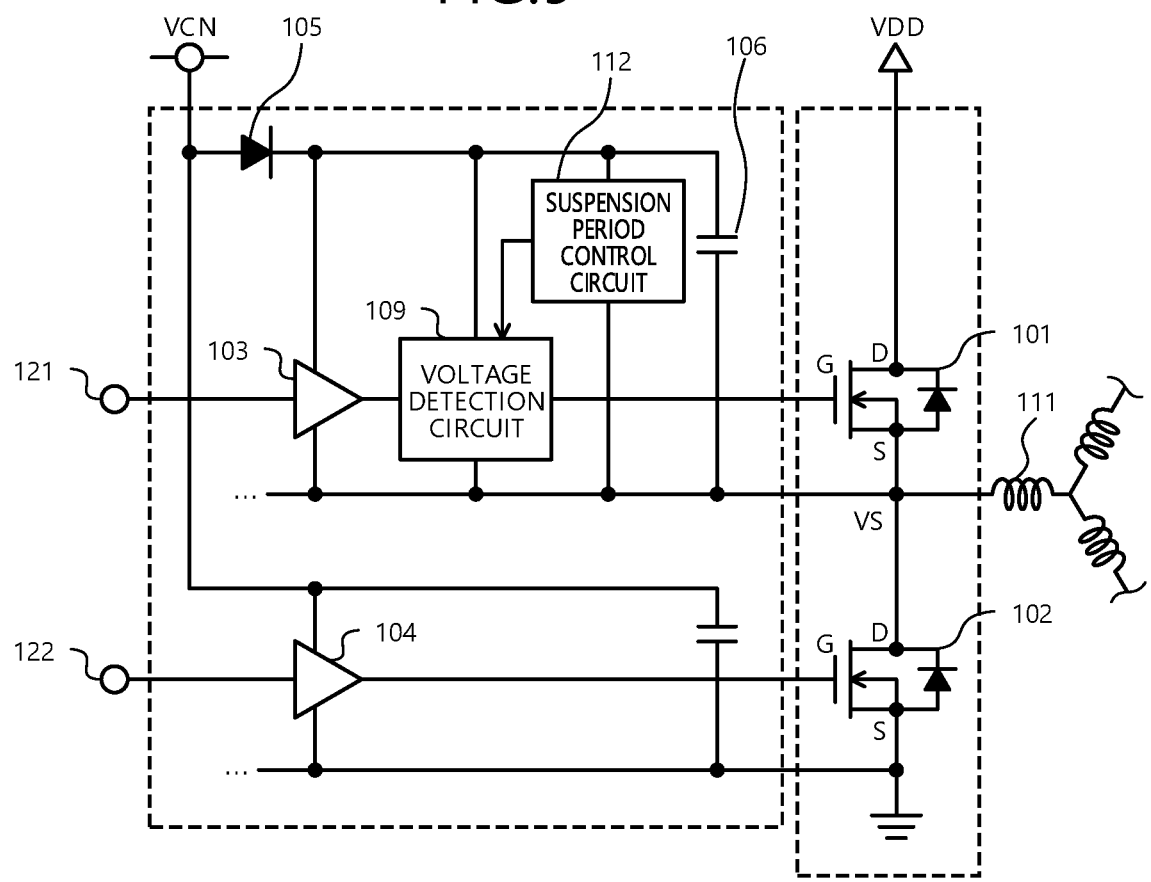
FIG. 9 is a circuit diagram of a circuit configuration of a conventional semiconductor circuit device.

A structure of a semiconductor device according to a second embodiment will be described. FIGS. 5A and 5B are plane views of a planar layout of a main portion of the semiconductor device according to the second embodiment. The semiconductor device according to the second embodiment is different from the semiconductor device according to the first embodiment in the following two points. The first difference is that a meander resistive element (hereinafter referred to as a first meander resistive element) 210 is disposed further in a second edge termination region 43b. The second difference is that a meander pattern of a meander resistive element (hereinafter referred to as a second meander resistive element) 220 in the first edge termination region 43a is different from that of the first embodiment.

Both ends of the first meander resistive element 210 are respectively connected electrically to the high-potential region 41 and the low-potential region 42 and arranged in a planar layout meandering in, for example, a lightning shape, to cover the second edge termination region 43a entirely. The first meander resistive element 210 has a meander pattern in which linear portions (thin-film resistive linear portions) 211 made of a resistive material such as polysilicon and linear portions (hereinafter referred to as conductive film linear portions) 212 made of a conductive material such as metal are alternately arranged with turning points interposed therebetween.

The second meander resistive element 220 has a meander pattern in which linear portions (thin-film resistive linear portions) 221 made of a resistive material such as polysilicon and linear portions (conductive film linear portions) 222 made of a conductive material such as metal are alternately arranged with turning points interposed therebetween. The thin-film resistive linear portions 221 of the meander pattern of the second meander resistive element 220 (respectively denoted by reference numerals 221a to 221e sequentially from the inside outwardly) are disposed on the same level as the thin-film resistive linear portions 211 of the meander pattern of the first meander resistive element 210 (respectively denoted by reference numerals 211a to 211e sequentially from the inside outwardly), for example.

The conductive film linear portions 222 of the meander pattern of the second meander resistive element 220 (respectively denoted by reference numerals 222a to 222d sequentially from the inside outwardly) are disposed on the same level as the conductive film linear portions 212 of the meander pattern of the first meander resistive element 210 (respectively denoted by reference numerals 212a to 212d sequentially from the inside outwardly), for example. The first and second meander resistive elements 210, 220 may turn back at the turning points of the meander patterns to form a substantially rectangular frame shape. Preferably, both the first and second meander resistive elements 210, 220 have an equal numbers of turns.

Additionally, the conductive film linear portions 212, 222 generate almost no voltage drop when the potential is increased at the inner end portions as compared to the outer end portions of the meander resistive elements 210, 220, and the voltage drop occurs only in the thin-film resistive linear portions 211, 221. The potentials at the turning points of the meander patterns of the meander resistive elements 210, 220 are substantially dependent on the voltage drops in the thin-film resistive linear portions 211, 221. As a result, the potential differences $\Delta V$ may be made substantially equal between the turning points of the meander pattern of the meander resistive element 210 and the turning points of the meander pattern of the meander resistive element 220.

For example, it is assumed that the number of turns of the meander patterns is eight in the meander resistive elements 210, 220. The linear portions of the meander pattern of the meander resistive element 210 have the thin-film resistive linear portion 211a disposed innermost, the conductive film linear portions 212 (212a to 212d) and the thin-film resistive linear portions 211 (211b to 211d) alternately arranged, and the thin-film resistive linear portion 211e disposed outermost. Similarly, the linear portions of the meander pattern of the meander resistive element 220 have the thin-film resistive linear portion 221a disposed innermost, the conductive film linear portions 222 (222a to 222d) and the thin-film resistive linear portions 221 (221b to 221d) alternately arranged, and the thin-film resistive linear portion 221e disposed outermost. The potential distribution in this case is as follows.

It is assumed that the same potential of V [V] is applied to both inner end portions at which the maximum potentials of the meander resistive elements 210, 220 are applied. Additionally, the same potential of 0 [V] is applied to both outer end portions at which the minimum potentials of the meander resistive elements 210, 220 are applied. In both the meander resistive elements 210, 220, the potentials of the thin-film resistive linear portions 211, 221 are reduced in the portions disposed on the outer side by 1/5×V [V] for each portion from the potential of V [V] at the inner end portion to the potential of 0 [V] at the outer end portion. Preferably, the inner end portions of the meander resistive elements 210, 220 are arranged as close as possible to each other and the outer end portions thereof are arranged as close as possible to each other. Thus, consistency may easily be ensured in the potential distributions of the meander resistive elements 210, 220.

As described above, the second embodiment may produce the same effect as the first embodiment.

A structure of a semiconductor device according to a third embodiment will be described. FIGS. 6A and 6B are plane views of a planar layout of an edge termination structure of the semiconductor device according to the third embodiment. The semiconductor device according to the third embodiment is different from the semiconductor device according to the first embodiment in the following three points. The first difference is that no conductive film layer of a resistive element 55 is disposed in the first edge termination region 43a. Thin-film resistive layers 57 of the resistive element 55 are arranged in a partially-opened substantially rectangular planar layout concentrically around the high-potential region 41 (and are respectively denoted by reference numerals 57a to 57e sequentially from the inner peripheral side). The thin-film resistive layers 57 of the resistive element 55 are arranged at equal intervals.

The second difference is that the first edge termination regions 43a are disposed at two positions to arrange two meander resistive elements 230 in the edge termination structure portion 43. The third difference is that the meander pattern of the meander resistive elements 230 is different from that of the first embodiment. The meander resistive elements 230 have the meander pattern in which linear portions (thin-film resistive linear portions) 231 made of a resistive material such as polysilicon and linear portions (conductive film linear portions) 232 made of a conductive material such as metal are alternately arranged with turning points interposed therebetween.

The thin-film resistive linear portions 231 of the meander pattern of the meander resistive elements 230 (respectively denoted by reference numerals 231a to 231e sequentially from the inside outwardly) are disposed on the same level as the thin-film resistive layers 57 of the resistive element 55. The conductive film linear portions 232 of the meander pattern of the meander resistive elements 230 (respectively denoted by reference numerals 232a to 232d sequentially from the inside outwardly) are disposed on a level different from the thin-film resistive layers 57 of the resistive element 55. Therefore, the thin-film resistive linear portions 231a to 231e and the conductive film linear portions 232a to 232d are arranged on different levels.

The thin-film resistive linear portions 231 of the meander pattern of the meander resistive elements 230 are arranged in a stripe-shaped planar layout at equal intervals of the same width as the thin-film resistive layers 57 of the resistive element 55 to form a concentric planar layout together with the thin-film resistive layers 57 of the resistive element 55. The conductive film linear portions 232 of the meander pattern of the meander resistive elements 230 are arranged in a planar layout oblique to the thin-film resistive linear portions 231 and couple the adjacent thin-film resistive linear portions 231 to each other to form portions of the meander pattern.

Also in this arrangement, as is the case with the second embodiment, the potentials of the thin-film resistive linear portions 231 of the meander resistive elements 230 are reduced in the portions disposed on the outer side by 1/5×V [V] for each portion from the potential of V [V] at the inner-peripheral end portion to the potential of 0 [V] at the outer-peripheral end portion.

As described above, the third embodiment may produce the same effect as the first and second embodiments.

The present invention described above is not limited to the embodiments described above and may be modified variously without departing from the spirit of the present invention. For example, a case of detecting the VB potential, the VS potential, and the VB-VS potential is taken as an example in the description of the embodiments; however, this is not a limitation and all the potentials/voltages in the high-potential region may be detected. Sense resistors other than the first and second sense resistors may be disposed for detecting other potentials/voltages. Although the first conductive type is the n-type and the second conductive type is the p-type in the embodiments, the present invention may be achieved in the same way by using the first conductive type as the p-type and the second conductive type as the n-type.

However, in Japanese Laid-Open Patent Publication No. H11-027950, the voltage (bootstrap voltage VBS) applied to both ends of the bootstrap capacitor 106 is monitored by the voltage detection circuit 109 on the high-potential side (on the high side), and the detection signal is communicated to the refresh operation circuit 110 on the low-potential side (on the low side). Therefore, the second level shift circuit 108 (level down circuit) is required for lowering the level of the detection signal of the voltage detection circuit 109 before transfer to the low side. Consequently, as compared to when the level down circuit is not mounted on a single semiconductor chip, the chip area is increased by the voltage detection circuit 109 and the level shift circuit 108. If a level shift circuit is added, the possibility of malfunction of the level shift circuit due to noise, etc. must be inspected. Therefore, the addition of the level down circuit is accompanied by difficulties.

Japanese Laid-Open Patent Publication No. 2013-085419 has a problem in that although the voltage abnormality of the bootstrap capacitor 106 may be fed back to the ON/OFF control of the upper arm transistor 101, the voltage abnormality cannot be fed back to the ON/OFF control of the lower arm transistor 102.

According to the invention described above, by arranging two or more resistive elements, a signal may be communicated from the high-potential side to the low-potential side without using a level shift circuit for lowering the level.

As described above, the semiconductor device according to the present invention is useful for power semiconductor devices used in power conversion apparatuses, power source apparatuses of various industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
a first semiconductor region disposed on a semiconductor substrate and having a varying reference potential;
a second semiconductor region disposed on the semiconductor substrate and fixed to a potential lower than a potential of the first semiconductor region; and
two or more resistive elements disposed between the first semiconductor region and the second semiconductor region and each having ends thereof electrically connected to the first semiconductor region and the second semiconductor region, the two or more resistive elements each outputting a different signal corresponding to a potential difference.

2. The semiconductor device according to claim 1, wherein the two or more resistive elements have respectively differing potentials on a high-potential side.

3. The semiconductor device according to claim 1, further comprising
a comparison circuit disposed in the second semiconductor region, and comparing signals of the two or more resistive elements and a predetermined signal, wherein
the comparison circuit compares respective signals of the two or more resistive elements, and
a potential difference in the first semiconductor region is detected based on a comparison result from the comparison circuit.

4. The semiconductor device according to claim 3, wherein the two or more resistive elements include:
a resistive element having a high-potential side connected to the reference potential of the first semiconductor region, and
a resistive element having a high-potential side connected to a maximum potential of the first semiconductor region, wherein
the comparison circuit detects a potential difference between the reference potential and the maximum potential of the first semiconductor region.

* * * * *